United States Patent
Hsu (10) Patent No.: US 9,876,106 B2
(45) Date of Patent: Jan. 23, 2018

(54) TRENCH POWER TRANSISTOR STRUCTURE AND MANUFACTURING METHOD THEREOF

(71) Applicant: SUPER GROUP SEMICONDUCTOR CO., LTD., Hsinchu County (TW)

(72) Inventor: Hsiu-Wen Hsu, Hsinchu County (TW)

(73) Assignee: SUPER GROUP SEMICONDUCTOR CO., LTD., Hsinchu (TW)

( * ) Notice: Subject to any disclaimer, the term of this patent is extended or adjusted under 35 U.S.C. 154(b) by 0 days.

(21) Appl. No.: 15/189,478

(22) Filed: Jun. 22, 2016

(65) Prior Publication Data
US 2017/0033213 A1    Feb. 2, 2017

(30) Foreign Application Priority Data
Jul. 31, 2015    (TW) ............................... 104124902 A (51) Int. Cl.
| H01L 29/78 | (2006.01) |
| H01L 29/66 | (2006.01) |
| H01L 29/49 | (2006.01) |
| H01L 29/40 | (2006.01) |

(52) U.S. Cl.
CPC ........ *H01L 29/7813* (2013.01); *H01L 29/407* (2013.01); *H01L 29/4916* (2013.01); *H01L 29/66734* (2013.01)

(58) Field of Classification Search
CPC .................................................. H01L 29/7813
USPC ......................................................... 257/330
See application file for complete search history.

(56) References Cited

U.S. PATENT DOCUMENTS

| 2004/0089910 A1* | 5/2004 | Hirler | ................... H01L 29/407 257/500 |
| 2009/0206395 A1* | 8/2009 | Hshieh | ................ H01L 29/0878 257/328 |
| 2013/0069145 A1* | 3/2013 | Kawano | ................ H01L 29/407 257/330 |

FOREIGN PATENT DOCUMENTS

| CN | 203746863 U | 7/2014 |
| CN | 104183494 A | 12/2014 |
| TW | 201001532 A | 1/2010 |
| TW | 201119035 A | 6/2011 |

* cited by examiner

*Primary Examiner* — Moazzam Hossain
*Assistant Examiner* — Warren H Kilpatrick
(74) *Attorney, Agent, or Firm* — Li & Cai Intellectual Property (USA) Office (57) ABSTRACT

A trench power transistor and a manufacturing method thereof are provided. The trench power transistor includes a substrate, an epitaxial layer, a trench gate structure, a body region, and a source region. The epitaxial layer disposed on the substrate has a trench formed therein. The trench gate structure disposed in the trench includes a bottom dielectric structure, a gate dielectric layer, and a gate. The bottom dielectric structure formed in a lower portion of the trench includes an insulating layer formed along a first inner wall of the lower portion of the trench defining a groove, and a non-conductive structure formed in the groove. The gate dielectric layer is formed along a second inner wall of an upper portion of the trench, and the gate is formed in the trench and connects the gate dielectric layer. The body region and the source region are formed in the epitaxial layer.

15 Claims, 8 Drawing Sheets

TRENCH POWER TRANSISTOR STRUCTURE AND MANUFACTURING METHOD THEREOF

BACKGROUND OF THE INVENTION

1. Field of the Invention

The instant disclosure relates to a power metal-oxide-semiconductor field-effect transistor (MOSFET) and manufacturing method thereof; in particular, to a trench power MOSFET having a bottom dielectric and a manufacturing method thereof.

2. Description of Related Art

Power metal-oxide-semiconductor field-effect transistors (Power MOSFET) are widely implemented in the switching devices of electric devices, such as power supplies, rectifiers or low voltage motor controllers and the like. The current power MOSFET is designed to have a vertical structure to improve the packing density. The power MOSFET having trench gate structure not only results in higher packing density, but also has lower on-state resistance. The power MOSFET having vertical structure is also called the trench power MOSFET. One of the advantages of the trench power MOSFET is that it is capable of controlling the operation of devices with low-power consumption.

The parameters affecting the characteristics of the power MOSFET include source-drain on-state resistance (Rdson), breakdown voltage and switching speed. However, the source-drain on-state resistance is positively correlated to the breakdown voltage. That is, the increase of the doping concentration of the drift region improves lower source-drain on-state resistance but sacrifices high breakdown voltage. Accordingly, many solutions have been developed to balance the charge of the drift region in order to reduce the source-drain on-state resistance without sacrificing the breakdown voltage.

One of the solutions is the bottom portion of the gate trench is filled with a thicker bottom oxide layer. However, the aspect ratio of the gate trench increases as the cell density and the breakdown voltage increase. Please refer to FIG. 1A and FIG. 1B, which respectively illustrate cross-sectional diagrams of a power MOSFET in different steps during the prior art fabricating method.

Figure 1A:
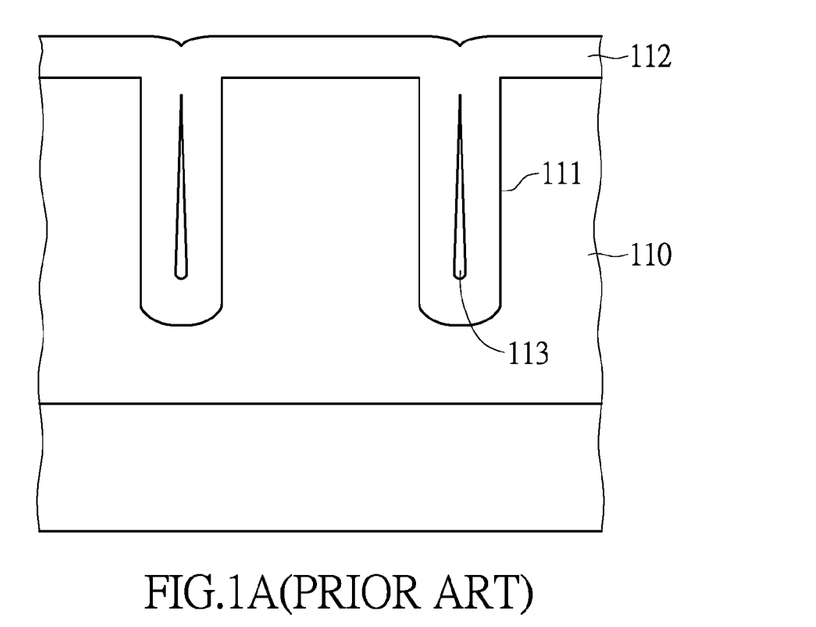
FIG. 1A shows a cross-sectional diagrams of a power MOSFET in different steps during the fabricating method in the prior art.

As shown in FIG. 1A, after the trenches 111 are formed in the epitaxial layer 110, an oxide 112 fills each of the trenches 111, to be formed on the bottom and the side walls of each of the trenches 111. However, an overhang of the oxide 112 is easily formed near an opening end of the trench 111 because the oxide 112 has poor step coverage. The overhang hangs over the remaining unfilled portion of the trench 111 forming a neck in the unfilled portion of the trench where the upper part of the unfilled portion of the trench 111 is narrower than the lower part of the unfilled portion of the trench 111, such that a void 113 is formed in the trench 111. Please refer to FIG. 1B. Subsequently, a portion of the oxide 112 formed on a top surface of the epitaxial layer 110 and an upper portion of the trench 111 is removed by etching process. The remained bottom oxide 112' located at a lower portion of the trench 110 still has a void 113' formed therein. It is likely that the void 113' extends from the upper surface to a bottom of the trench 111.

Figure 1B:
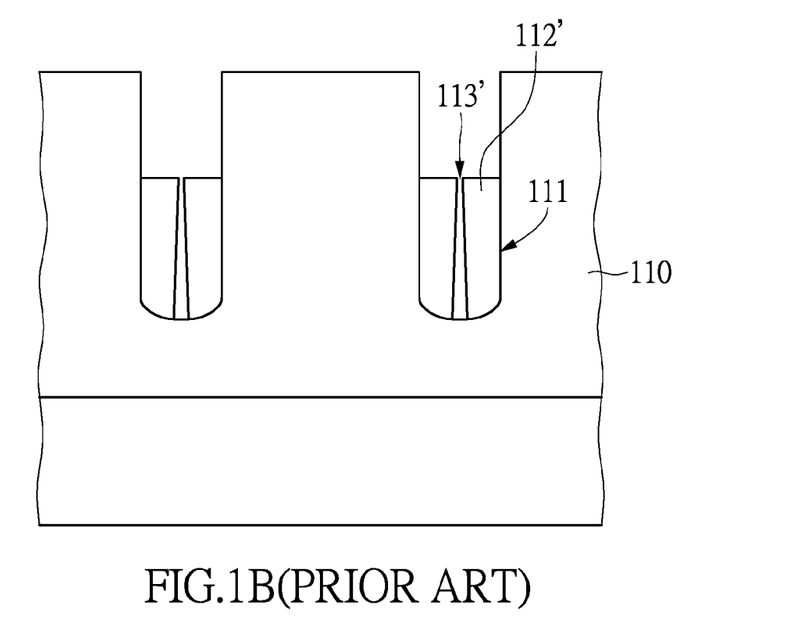
FIG. 1B shows a cross-sectional diagrams of a power MOSFET in different steps during the fabricating method in the prior art.

During the following deposition process of the gate structure in the trench 111, the gate structure fills the void 113' and may be directly in contact with the epitaxial layer, which would result in poor electrical performance of the power MOSFET.

SUMMARY OF THE INVENTION

The object of the instant disclosure is to provide a trench power transistor and a manufacturing method thereof. By depositing different materials to form a bottom dielectric structure in the trench, the formation of the void in the trench can be avoided.

In order to achieve the aforementioned objects, according to an embodiment of the instant disclosure, a trench power transistor is provided. The trench power transistor includes a substrate, an epitaxial layer, a trench gate structure, a body region, and a source region. The epitaxial layer is formed on the substrate, and has at least one trench formed therein. The trench gate structure is disposed in the trench, and includes a bottom dielectric structure, a gate dielectric layer, and a gate. The bottom dielectric structure formed in a lower portion of the trench includes an insulating layer and a non-conductive structure. The insulating layer is formed along a first inner wall of the lower portion of the trench defining a groove at the lower portion of the trench. The non-conductive structure is formed in the groove. The gate dielectric layer is formed along a second inner wall of an upper portion of the trench, and the gate is filled in the trench and connects the gate dielectric layer. The body region is formed in the epitaxial layer and surrounds the trench gate structure. The source region is formed in the epitaxial layer, and located over the body region.

According to another embodiment of the instant disclosure, a manufacturing method of the trench power transistor is provided. The manufacturing method includes the steps of providing a substrate; forming an epitaxial layer on the substrate; forming a trench in the epitaxial layer; forming a bottom dielectric structure in a lower portion of the trench, in which the bottom dielectric structure includes an insulating layer formed along a first inner wall of a lower portion of the trench defining a groove, and a non-conductive structure formed in the groove; forming a gate dielectric layer along a second inner wall of an upper portion of the trench and an upper surface of the bottom dielectric structure; forming a gate in the trench; performing a base doping process in the epitaxial layer to form a body region; and performing a source implantation to form a source region located over the body region.

To sum up, the trench power transistor and the manufacturing method thereof in accordance with the instant disclosure can make the formation of the bottom dielectric structure without the formation of the void in the trench. In addition, the bottom dielectric structure can assist with charge balance of the drift region. As such, the trench power transistor can have higher breakdown voltage without sacrificing the lower source-drain on-state resistance.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. In reference to the disclosure herein, for purposes of convenience and clarity only, directional terms, such as, top, bottom, left, right, up, down, over, above, below, beneath, rear, front, distal, and proximal are used with respect to the accompanying drawings. Such directional terms should not be construed to limit the scope of the invention in any manner. In addition, the same reference numerals are given to the same or similar components.

Figure 2:
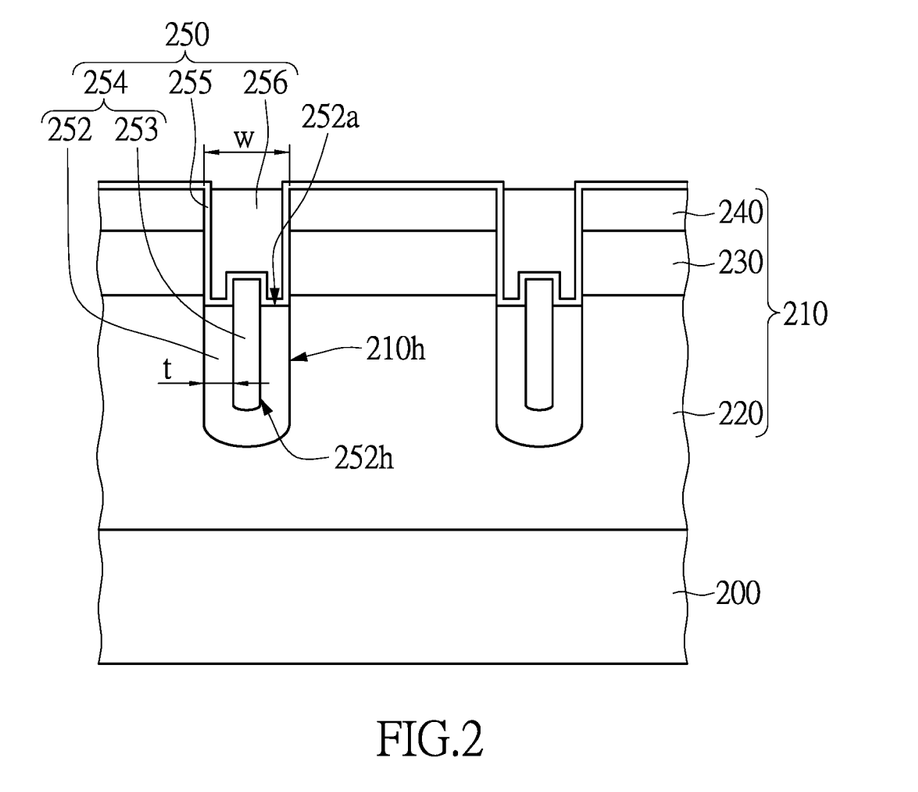
FIG. 2 shows a local sectional view of a trench power transistor provided in accordance with another embodiment of the instant disclosure.

FIG. 2 shows a local sectional view of a trench power transistor provided in accordance with another embodiment of the instant disclosure.

As shown in FIG. 2, the substrate 200 is doped with a higher concentration of first conductivity type impurities to form a first heavily doped region. The first heavily doped region can serve the function of the drain of the trench power transistor, and may occupy a local region or the overall region of the substrate 200. In the instant embodiment, the first heavily doped region occupies the overall region of the substrate 200, which is only used as an example, but not so as to limit the scope of the invention. The aforementioned first conductivity type impurities may be N-type or P-type conductivity impurities. If the substrate 200 is a silicon substrate, the N-type conductivity impurities may be Group V ions such as phosphorus ions or arsenic ions, and the P-type conductivity impurities may be Group III ions such as boron ions, aluminum ions or gallium ions.

If the trench power transistor is N-type power MOSFET, the substrate 200 is doped with N-type conductivity impurities, whereas if the trench power MOSFET is P-type, the substrate 200 is doped with P-type conductivity impurities. In the embodiment of the instant disclosure, the N-type trench power MOSFET is taken as an example to describe the invention.

The epitaxial layer 210 is formed on the substrate 200 and doped with a lower concentration of the first conductivity type impurities. That is, taking the N-type trench power MOSFET for example, the substrate 200 is a heavily N-type doping (N+) substrate and the epitaxial layer 210 is a lightly N-type doping (N−) layer. On the contrary, taking the P-type trench power MOSFET for example, the substrate 200 is a heavily P-type doping (P+) substrate and the epitaxial layer 110 is a lightly P-type doping (P−) layer. The epitaxial layer 210 includes at least one trench 210h formed therein, and at least one trench gate structure 250 is formed in the corresponding trench 210h and in the epitaxial layer 210.

Notably, although two trench gate structures 250 respectively formed in two trenches 210h are illustrated in FIG. 2 to be taken as an example for description of the instant disclosure, the trench power transistor can have only one or more than two trench gate structures 250. The number of the trench gate structures 250 is not limited to the example provided herein.

In addition, the epitaxial layer 210 includes a drift region 220, a body region 230, and a source region 240. The body region 230 and the source region 240 are formed in the epitaxial layer 210 enclosing the side wall of the trench gate structure 250.

Furthermore, the body region 230 is formed by implanting second conductivity type impurities into the epitaxial layer 210, and the source region 240 is formed over the body region 230 by implanting high-concentration first conductivity type impurities in an upper portion of the body region 230. For example, in the N-type trench power MOSFET, the body region 230 is a P-type dopant region, i.e., P-well, and the source region 240 is an N-type dopant region. Additionally, the doping concentration of the body region 230 is lower than that of the source region 240.

That is to say, by doping different conductivity type impurities in different regions and making the different regions have different concentrations, the epitaxial layer 210 can be divided into the drift region 220, the body region 230, and the source region 240. The body region 230 and the source region 240 are immediately adjacent to the side walls of the trench gate structure 250, and the drift region 220 is located nearer to the substrate 200. In other words, the body region 230 and the source region 240 are located at an upper portion of the epitaxial layer 210, and the drift region 220 is located at a lower portion of the epitaxial layer 210.

Each of the trench gate structures 250 includes a bottom dielectric structure 254, a gate dielectric layer 255 and a gate 256. All of the bottom dielectric structure 254, the gate dielectric layer 255 and the gate 256 are formed at the inside of the trench 210h, and the gate dielectric layer 255 is formed to conformally cover an inner wall of the trench 210h so that the gate 256 can be isolated from the epitaxial layer 210.

Notably, the trench of the embodiment of the instant disclosure is a deep trench. That is, the trench 210h extends from a top surface of the epitaxial layer 210 to a depth greater than that of the body region 230, i.e., the trench 210h extends into the drift region 220 so that the bottom of the trench 210h is closer to the substrate 210.

The trench power transistor has an aforementioned deep trench which helps increase the breakdown voltage thereof. In one embodiment, the trench 210h has a relatively higher aspect ratio ranging about from 5 to 15. However, the deep trench may result in higher source-drain on-state resistance (Rdson). In order to reduce the source-drain on-state resistance, the doping concentration of the drift region 220 can be increased.

Furthermore, to improve the problem of the breakdown voltage being reduced due to the increase of the doping concentration of the drift region 220, the bottom dielectric structure 254 is formed in a lower portion of the trench 210h. Notably, a lowest plane of the body region 230 is taken as a reference plane to substantially divide the trench 210h into the upper portion and a lower portion.

The bottom dielectric structure 254 includes an insulating layer 252 and a non-conductive structure 253. The insulating layer 252 is formed along a first inner wall of the lower portion of the trench 210h, and defines a groove in the trench 252h. The insulating layer 252 has a top surface 252a, and the top surface 252a is located at a level equal to or lower than a lowest edge of the body region 230.

Additionally, the thickness of the insulating layer 252 is associated with the trench width (W) and the process limitations. In one embodiment, the ratio of a side thickness (t) of the insulating layer 252 to the trench width (W) ranges from 0.2 to 0.5. Specifically, assuming the trench width (W) is 0.3 um, the thickness of the insulating layer 252 ranges from 600 A to 1300 A. The insulating layer 252 can be a monolayer or a multilayer structure. The insulating layer 252 can be made of oxide or nitride, such as silicon oxide (SiOx), silicon nitride, or an oxide-nitride-oxide stacked layer.

The non-conductive structure 253 is formed in the groove defined by the insulating layer 252. In one embodiment, a top face of the non-conductive structure 253 is located at a higher level than the top surface 252a of the insulating layer 252. In another embodiment, the top face of the non-conductive structure 253 can be coplanar with or slightly lower than the top surface 252a of the insulating layer 252. That is, as long as the groove 252h defined by the insulating layer 252 can be filled with the non-conductive structure 253, the shape of the non-conductive structure 253 is not limited in the instant disclosure. In the instant embodiment, the non-conductive structure 253 can be made of insulator or intrinsic semiconductor, in which the intrinsic semiconductor can be selected from group IVA components or group III-V materials, such as silicon (Si), germanium (Ge), or gallium arsenide (GaAs). In one embodiment, the non-conductive structure 253 is un-doped polysilicon structure or un-doped amorphous silicon structure.

It is worth noting that the bottom dielectric structure 254, which is a bottom portion of the trench gate structure 250 can result in charge balance in the drift region 220 interposed between two adjacent trenches 210h, such that the breakdown voltage of the trench power transistor can be improved. Under the condition of the increase of the breakdown voltage, the maximum doping concentration of the drift region 220 can be increased to further reduce the source-drain on-state resistance.

The bottom dielectric structure 254 made of oxide and intrinsic semiconductor can maintain the charge balance in the drift region 220 interposed between the two adjacent trenches 210h because the intrinsic semiconductor exhibits an electrical insulation property. In addition, compared with the oxide layer, because the intrinsic semiconductor layer has better filling ability, the formation of the void in the bottom dielectric structure 254 can be avoided during the fabrication of the bottom dielectric structure 254 in the trench 210h having high aspect ratio. The fabrication of the bottom dielectric structure 254 will be described following, and omitted here.

The gate dielectric layer 255 is formed along a second inner wall of the upper portion of the trench 210h. In one embodiment, the gate dielectric layer 255 has a thickness less than a thickness of the insulating layer 252. Furthermore, a portion of the gate dielectric layer 255 completely covers the top face of the non-conductive structure 253. In the embodiment shown in FIG. 2, the gate dielectric layer 255 also completely covers the top surface 252a of the insulating layer 252. However, in another embodiment, the gate dielectric layer 255 can partially cover the top surface 252a of the insulating layer 252. The gate dielectric layer 255 can be made of nitride or oxide, such as silicon nitride, silicon oxide, aluminum oxide or the transition metal oxide, which is not limited to the examples provided herein.

The gate 256 is formed in the upper portion of the trench 210h, and located over the non-conductive structure 253. Additionally, the gate 256 is insulated from the epitaxial layer 210 by the gate dielectric layer 255. In one embodiment, the gate 256 is heavily doped polysilicon structure. When the gate 256 and the non-conductive structure 253 are respectively made of heavily doped polysilicon and undoped polysilicon, the gate 256 is isolated from the non-conductive structure 253 by the portion of the gate dielectric layer 255 covering the top face of the non-conductive structure 253, so as to prevent the impurities doped in the gate 256 from diffusing into the non-conductive structure 253.

In another embodiment, the non-conductive structure 253 is made of insulator, instead of intrinsic semiconductor. In this case, the portion of the gate dielectric layer 255 covering the top face of the non-conductive structure 253 can be omitted, so that the gate 256 is directly in contact with the non-conductive structure 253.

In addition, when the gate dielectric layer 255 has a thickness less than the thickness of the insulating layer 252, the gate 256 has a width greater than the width of the non-conductive structure 253. The gate 256 has a lowest surface which is located at a level lower than the lowest edge of the body region 230 to ensure the formation the carrier channel (hole channel or electron channel) when a bias is applied to the gate 256. Taking the N-type trench power MOSFET for example, when a positive bias is applied to the gate 256, the electrons in the body region 230 accumulate at the side walls of the trench 210h and form a carrier channel between the source region and the drain region so that the trench power transistor is in ON state.

Figure 3:
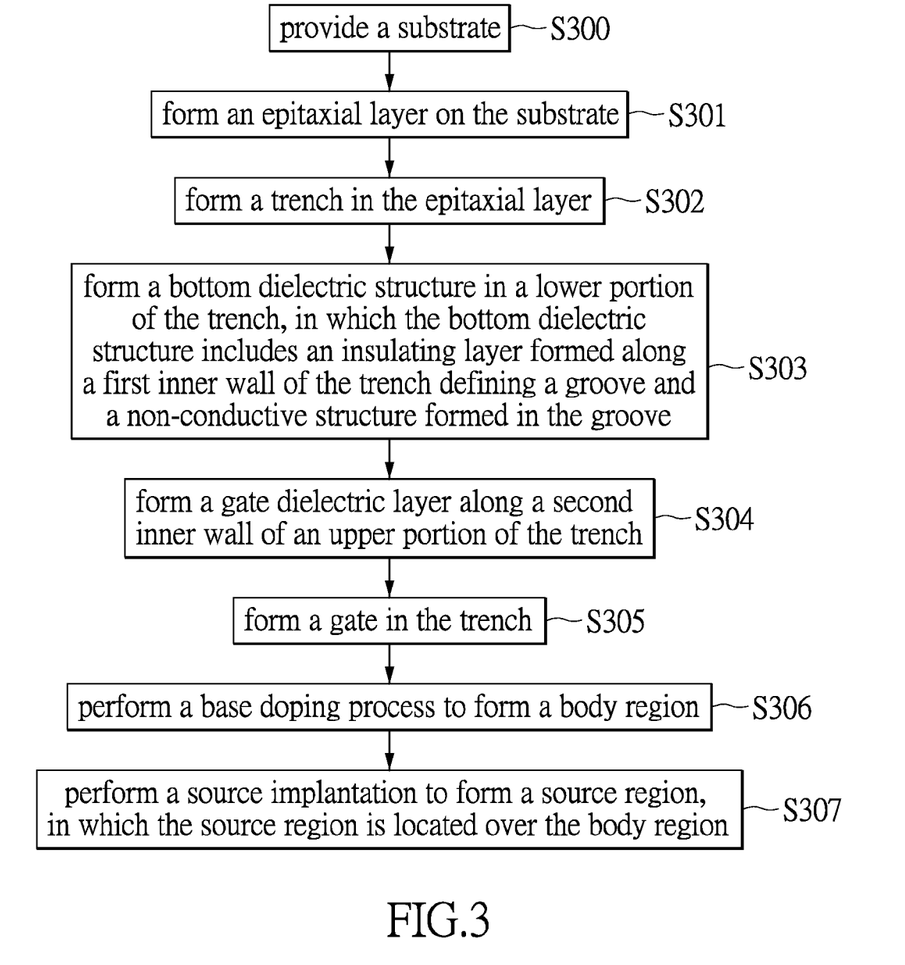
FIG. 3 is a flowchart illustrating the manufacturing method of the trench power transistor provided in accordance with an embodiment of the instant disclosure.

In addition, a manufacturing method of the trench power transistor is provided. Please refer to FIG. 3 and FIGS. 4A to 4I. FIG. 3 is a flowchart illustrating the manufacturing method of the trench power transistor provided in accordance with an embodiment of the instant disclosure. FIGS. 4A to 4I respectively show schematic sectional views of the trench power transistor in different steps of the manufacturing method provided in accordance with an embodiment of the instant disclosure.

Figure 4A:
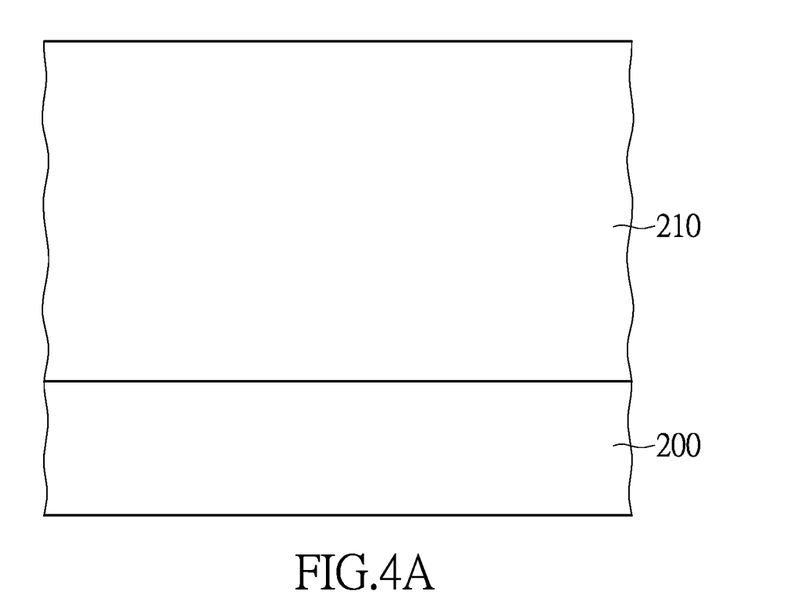
FIGS. 4A to 4I respectively show schematic sectional views of the trench power transistor in different steps of the manufacturing method provided in accordance with an embodiment of the instant disclosure.
Figure 4B:
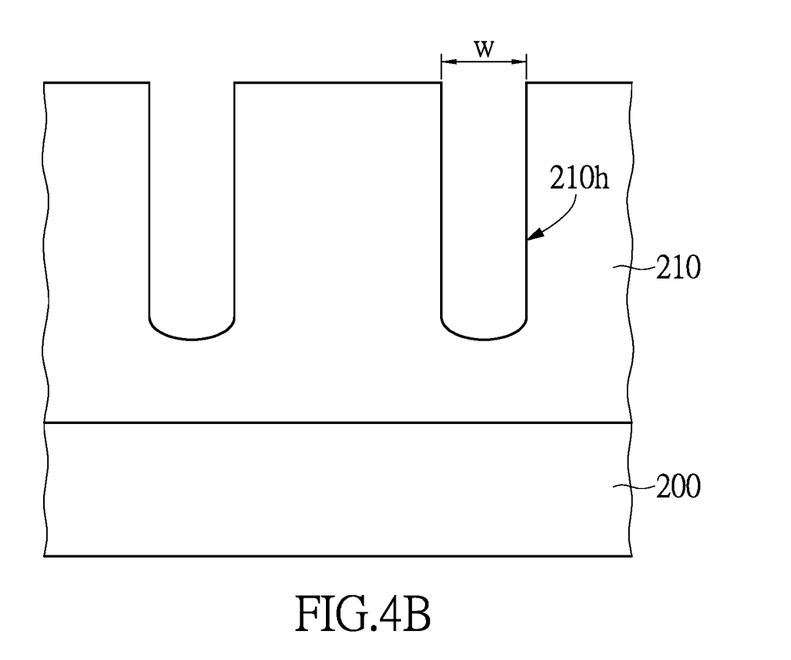

In step S300, a substrate is provided. Next, in step S301, an epitaxial layer is formed on the substrate. Please refer to FIG. 4A. FIG. 4A illustrates the substrate 200 and the epitaxial layer 210 disposed on the substrate 200. The substrate 200 is such as a silicon substrate doped with a higher concentration of first conductivity type impurities to form a first heavily doped region to serve the function of the drain of the trench power transistor. The epitaxial layer 210 has a lower doping concentration.

Subsequently, in step S302, a trench is formed in the epitaxial layer. Please refer to FIG. 4B, one or more trenches 210h are formed in the epitaxial layer 210. In one embodiment, a mask (not shown in FIG. 4B) is used to define the positions of the trenches 210h in advance, and one or more trenches 210h may be formed in the epitaxial layer 210 by performing dry etching or wet etching. In the instant embodiment, each of the trenches 210h has a high aspect ratio ranging from 5 to 15.

Subsequently, in step S303, a bottom dielectric structure is formed in a lower portion of the trench, in which the bottom dielectric structure includes an insulating layer and a non-conductive structure. The insulating layer is formed along a first inner wall of the lower portion of the trench and defines a groove, and the non-conductive structure fills in the groove. FIGS. 4C to 4F illustrate the process steps in greater detail.

Figure 4C:
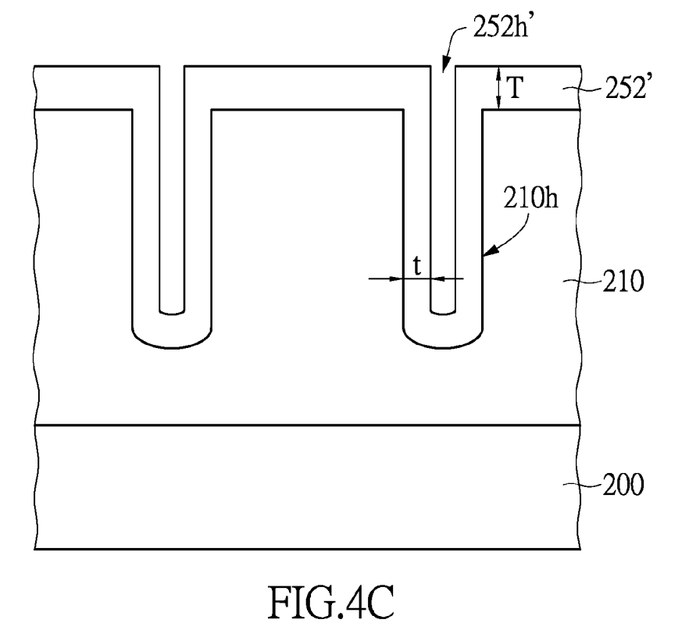

Please refer to FIG. 4C. A first insulating layer 252' is deposited on the epitaxial layer 210. The first insulating layer 252' can be an oxide layer or a nitride layer. For example, the first insulating layer 252' is an oxide layer and can be formed by thermal oxidation process. In another embodiment, the first insulating layer 252' may be formed by physical vapor deposition (PVD) or chemical vapor deposition (CVD). The first insulating layer 252' is formed on a top surface of the epitaxial layer 210 and covers the inner walls of the trench 210h (including the bottom surface and the two opposite sidewall surfaces of the trench 210h).

Notably, when the first insulating layer 252' is deposited, a thickness (T) of the first insulating layer 252' formed on the surface epitaxial layer 210 is greater than a side thickness (t) of the first insulating layer 252' formed on the sidewall surface of the trench 210h. Accordingly, in the instant embodiment, the deposition process of the first insulating layer 252' has to be finished before the overhang of the first insulating layer 252' seals the trench 210h. Specifically, after the deposition process of the first insulating layer 252', the first insulating layer 252' can define a first groove 252h' in the trench 210h. In one embodiment, the ratio of the side thickness (t) of the first insulating layer 252' formed on the sidewall surface of the trench 210h to a trench width (W) ranges from 0.2 to 0.5.

Figure 4D:
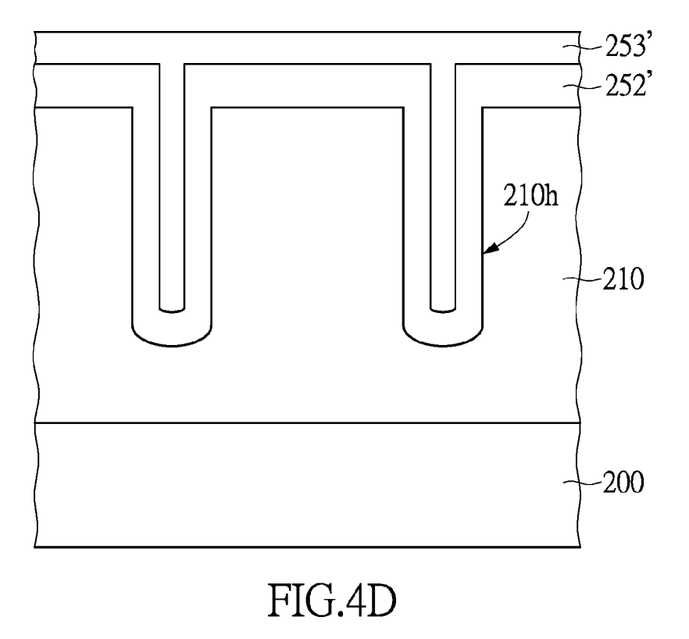

Subsequently, please refer to FIG. 4D. The first groove 252h' is filled with a non-conductive material 253'. Specifically, the non-conductive material 253' completely covers the first insulating layer 252' on the top surface of the epitaxial layer 210 and fills the first groove 252h'.

In one embodiment, the non-conductive material 253' has better filling ability compared to the first insulating layer 252'. For example, the non-conductive material 253' can be an intrinsic semiconductor, which can be selected from group IVA components or group III-V materials. In a preferred embodiment, the conductive material 253' is un-doped polysilicon or un-doped amorphous silicon.

Additionally, the non-conductive material 253' can be deposited in the first groove 252h' and on the top surface of the epitaxial layer 210 by performing chemical vapor deposition. The statistical result shows that the precursors for depositing the polysilicon have better flowability and filling ability than the precursors for depositing the oxide during the chemical vapor deposition (CVD). Accordingly, when the non-conductive material is un-doped polysilicon and fabricated by CVD to fill the first groove 252h', the formation of the void in the trench 210h can be avoided.

Furthermore, in one embodiment of the instant disclosure, although the first insulating layer 252' is an oxide layer, the first insulating layer 252' does not need to be etched back and then repeat the deposition process once again to avoid the formation of the void. That is, by filling the un-doped polysilicon into the first groove 252h', the steps of depositing and etching oxide layer do not need to be repeated, and the fabrication complexity and the cost can be reduced.

Figure 4E:
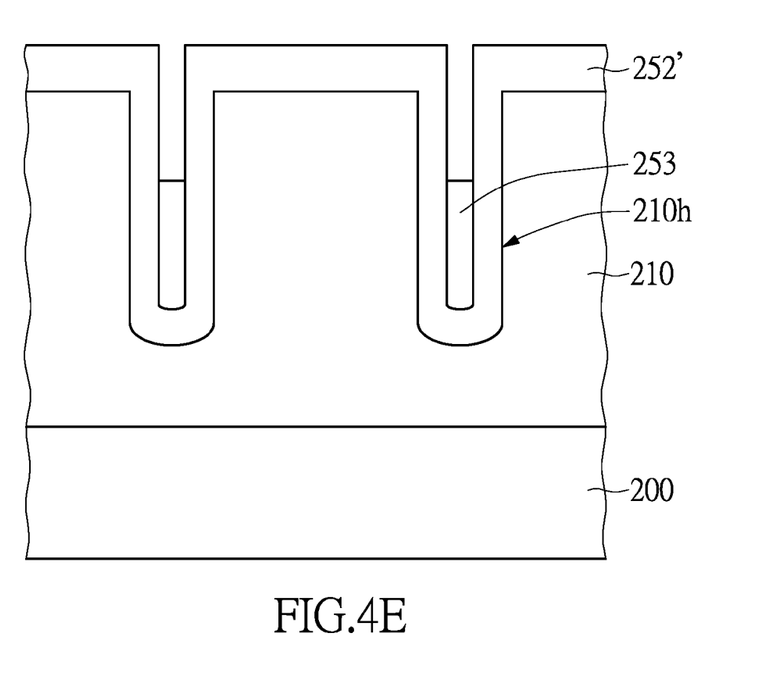

Subsequently, please refer to FIG. 4E. As shown in FIG. 4E, a portion of the non-conductive material 253' covering the first insulating layer 252' and located in the upper portion of the trench 210h is removed by an etching back process to form the non-conductive structure 253 located in the lower portion of the trench 210h.

Figure 4F:
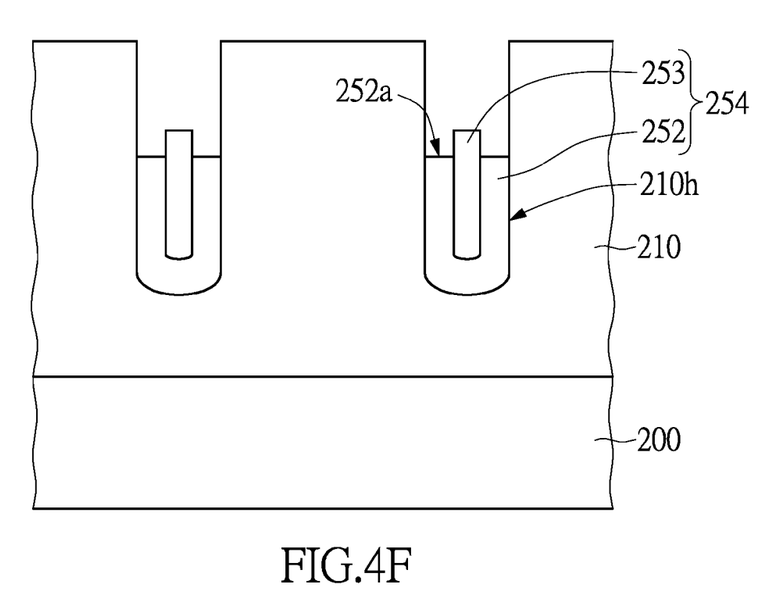

Please refer to FIG. 4F. An etching process is performed to remove a portion of the first insulating layer 252' covering the top surface of the epitaxial layer 210 and a second inner wall of the upper portion of the trench 210h. In one embodiment, the etching process (selectively etching process) can be performed by using the non-conductive structure 253 as a mask to remove a portion of the first insulating layer 252'.

It is worth noting that in the step shown in FIG. 4E, because the non-conductive structure is formed in the lower portion of the trench 210h and shields the first insulating layer 252' located in the lower portion of the trench 210h, the etching process does not make the first insulating layer 252' located at the lower portion of the trench 210h have thinner thickness. After a portion of the first insulating layer 252' is removed, the insulating layer 252 (the residual first insulating layer 252') is formed in the lower portion of the trench 210h. Additionally, in one embodiment, the top surface 252a of the insulating layer 252 located at a level lower than the top face of the non-conductive structure 253.

Subsequently, in step S304, a gate dielectric layer is formed along a second inner wall of the upper portion of the trench.

Figure 4G:
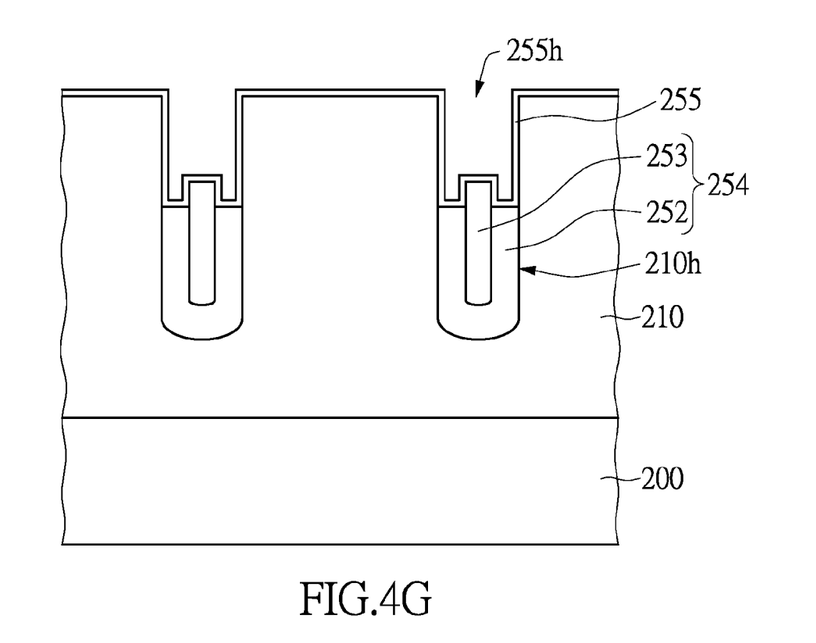

As shown in FIG. 4G, the gate dielectric layer 255 conformingly covers the inner wall of the upper portion of the trench 210h and the top surface of the epitaxial layer 210. Furthermore, the gate dielectric layer 255 defines a second groove 255h inside of the trench 210h.

In the instant embodiment, the gate dielectric layer 255 covers an upper surface of the bottom dielectric structure 254, i.e., the top surface 252a of the insulating layer 252 and the top face of the non-conductive structure 253. In another embodiment, if the non-conductive structure 253 is made of insulator, the gate dielectric layer 255 can only cover the second inner wall of the upper portion of the trench 210h. The fabrication process of the gate dielectric layer 255 can be the same as that of the first insulating layer 252' shown in FIG. 4C. For example, the gate dielectric layer 255 and the first insulating layer 252' can be formed by performing the thermal oxidation process. In another embodiment, the fabrication process of the gate dielectric layer 255 can be different from that of the first insulating layer 252'. Furthermore, the gate dielectric layer 255 can be an oxide layer or a nitride layer. In the embodiment of the instant disclosure, the gate dielectric layer 255 has a thickness less than the thickness of the insulating layer 252.

Figure 4H:
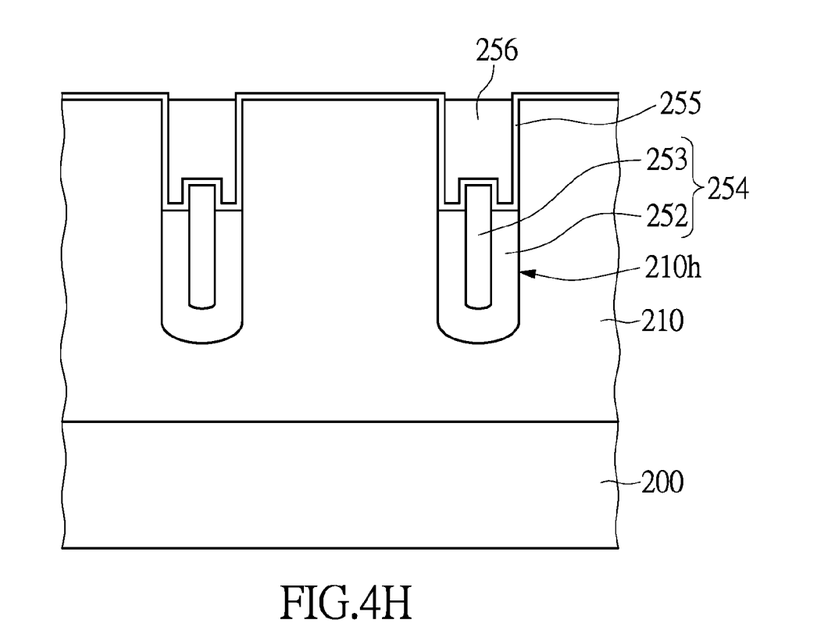

Subsequently, in step S305, a gate is formed in the trench. Specifically, as shown in FIG. 4H, when the gate 256 is a heavily doped polysilicon structure, the step of forming the gate 256 in the trench 210h can include blanketly forming a polysilicon structure to cover all of the surface of the gate dielectric layer 255 and fill in the second groove 255h defined by the gate dielectric layer 255. In addition, the polysilicon structure has a heavily doped region. For example, the polysilicon structure can be doped with P-type conductivity impurities, such as boron, aluminum, or gallium, or N-type conductivity impurities, such as phosphor or arsenic to form the heavily doped region. In addition, the polysilicon structure can be formed by in-situ doping CVD process.

It is worth noting that performing the in-situ CVD process to form the polysilicon structure doped with the conductivity impurities can save time and cost of the ion implantation and annealing process. In another embodiment, the fabrication process of the polysilicon structure can include the steps of forming a non-doped polysilicon structure, performing an ion implantation to the non-doped polysilicon structure and subsequently annealing the doped polysilicon structure.

Thereafter, a portion of the polysilicon structure located on the top surface of the epitaxial layer is removed by an etching back process, and another portion of the polysilicon structure is left in the trench 210h to serve as the gate 256.

And then proceed to steps S306 and S307. In step S306, a base doping process is carried out in the epitaxial layer to form a body region. In step S307, a source implantation is performed to form a source region, and the source region is located over the body region.

Figure 4I:
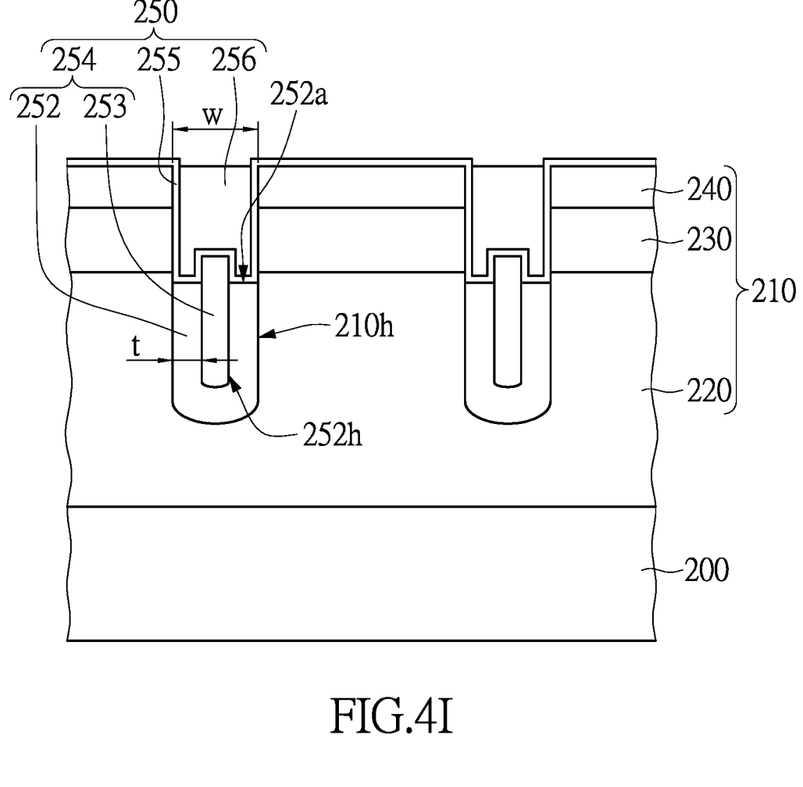

Please refer to FIG. 4I. The epitaxial layer 210 is doped by performing the base doping process to form a first doped region. The first doped region is formed at one side far from the substrate 200. After the formation of the first doped region, the source implantation is performed to implant the first doped region to form the source region 240 and the body region 230. Specifically, after the source implantation is performed to implant the first doped region, a thermal diffusion process is performed to form the source region 240.

Additionally, as shown in FIG. 4I, in the instant embodiment, the lowest edge of the body region 230 is higher than the level at which the top surface 252a of the insulating layer 252 is located. According to the abovementioned embodiments, one of ordinary skill in the art can easily understand the other steps performed in the abovementioned embodiments in detail, and the relative descriptions are omitted herein.

In summary, the power trench transistor and the manufacturing method thereof in the embodiment of the instant disclosure can benefit the formation of the bottom dielectric structure in the lower portion of the trench with high aspect ratio. The manufacturing method provided in the instant disclosure can avoid the formation of the void in the trench during the fabrication process of the bottom dielectric structure in the trench. In addition, the bottom dielectric structure can assist with charge balance of the drift region to improve the higher breakdown voltage. As such, the maximum doping concentration of the drift region 220 can be increased so that the trench power transistor can have lower source-drain on-state resistance.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A trench power transistor comprising :
   a substrate;
   an epitaxial layer formed on the substrate, wherein the epitaxial layer has a trench formed therein;
   a trench gate structure disposed in the trench and comprising:
      a bottom dielectric structure formed in a lower portion of the trench, wherein the bottom dielectric structure includes an insulating layer and a non-conductive structure, the insulating layer is formed along a first inner wall of the lower portion of the trench defining a groove, and the non-conductive structure is made of intrinsic semiconductor and formed in the groove;
      a gate dielectric layer formed along a second inner wall of an upper portion of the trench; and
      a gate formed in the trench and connecting the gate dielectric layer;
   a body region formed in the epitaxial layer and surrounding the trench gate structure; and
   a source region formed in the epitaxial layer and located over the body region.

2. The trench power transistor according to claim 1, wherein a top face of the non-conductive structure is located at a higher level than a top surface of the insulating layer.

3. The trench power transistor according to claim 1, wherein the gate dielectric layer completely covers a top surface of the insulating layer.

4. The trench power transistor according to claim 1, wherein a top surface of the insulating layer is located at a level equal to or lower than a lowest edge of the body region.

5. The trench power transistor according to claim 1, wherein the gate is a heavily doped polysilicon structure and the non-conductive structure is an un-doped polysilicon structure.

6. The trench power transistor according to claim 5, wherein a portion of the gate dielectric layer completely covers a top face of the non-conductive structure so that the gate and the non-conductive structure are isolated from each other.

7. The trench power transistor according to claim 1, wherein a portion of the insulating layer formed on a sidewall surface of the trench has a side thickness, and a ratio of the side thickness to a trench width ranges from 0.2 to 0.5.

8. A manufacturing method of a trench power transistor comprising:
   providing a substrate;
   forming an epitaxial layer on the substrate;
   forming a trench in the epitaxial layer;
   forming a bottom dielectric structure in a lower portion of the trench, wherein the bottom dielectric structure includes an insulating layer formed along a first inner wall of the lower portion of the trench defining a groove, and a non-conductive structure made of intrinsic semiconductor and formed in the groove;
   forming a gate dielectric layer along a second inner wall of an upper portion of the trench;
   forming a gate in the trench;
   performing a base doping process in the epitaxial layer to form a body region; and
   performing a source implantation to form a source region located over the body region.

9. The manufacturing method of the trench power transistor according to claim 8, wherein the step of forming the bottom dielectric structure comprising:
   forming a first insulating layer to cover an inner wall of the trench, wherein the first insulating layer defines a first groove in the trench;
   filling a non-conductive material in the first groove;
   removing a portion of the non-conductive material located at the upper portion of the trench to form the non-conductive structure at the lower portion of the trench; and
   partially removing the first insulating layer located at the upper portion of the trench to form the insulating layer located at the lower portion of the trench.

10. The manufacturing method of the trench power transistor according to claim 8, wherein a top face of the non-conductive structure is located at a higher level than a top surface of the insulating layer.

11. The manufacturing method of the trench power transistor according to claim 8, wherein the trench extends from a top surface of the epitaxial layer to a depth greater than that of the body region. The manufacturing method of the trench power transistor according to claim 8, wherein a top surface of the insulating layer is located at a level equal to or lower than a lowest edge of the body region.

12. The manufacturing method of the trench power transistor according to claim 8, wherein a top surface of the insulating layer is located at a level equal to or lower than a lowest edge of the body region.

13. The manufacturing method of the trench power transistor according to claim 8, wherein the gate is a heavily doped polysilicon structure and the non-conductive structure is an un-doped polysilicon structure.

14. The manufacturing method of the trench power transistor according to claim 13, wherein a portion of the gate dielectric layer completely covers a top face of the non-conductive structure so that the gate and the non-conductive structure are isolated from each other.

15. The manufacturing method of the trench power transistor according to claim 8, wherein a portion of the insulating layer formed on a sidewall surface of the trench has a side thickness, and a ratio of the side thickness to a trench width ranges from 0.2 to 0.5.

* * * * *